United States Patent
Roohparvar

(10) Patent No.: US 6,598,113 B2
(45) Date of Patent: *Jul. 22, 2003

(54) STATE MACHINE HAVING EACH EXECUTION CYCLE DIRECTLY CONNECTED TO A SUSPEND CYCLE TO ACHIEVE FAST SUSPEND OF ERASE OPERATION IN FLASH MEMORIES

(75) Inventor: Frankie Fariborz Roohparvar, Cupertino, CA (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/567,574

(22) Filed: May 10, 2000

(65) Prior Publication Data

US 2002/0035661 A1 Mar. 21, 2002

Related U.S. Application Data

(63) Continuation of application No. 08/965,253, filed on Nov. 6, 1997, now Pat. No. 6,081,870.

(51) Int. Cl.⁷ .......................... G06F 13/10; G11C 16/06
(52) U.S. Cl. .................. 711/103; 365/185.29; 365/218
(58) Field of Search ................................ 711/103, 154, 711/166; 365/185.29, 185.33, 218

(56) References Cited

U.S. PATENT DOCUMENTS

| | | | | | |
|---|---|---|---|---|---|
| 5,355,464 | A | * | 10/1994 | Fandrich et al. | 365/218 |
| 5,568,426 | A | * | 10/1996 | Roohparvar et al. | 365/185.22 |
| 5,940,861 | A | * | 8/1999 | Brown et al. | 711/154 |
| 6,081,870 | A | * | 6/2000 | Roohparvar et al. | 711/103 |
| 6,189,070 | B1 | * | 2/2001 | See et al. | 711/103 |

* cited by examiner

Primary Examiner—Glenn Gossage
(74) Attorney, Agent, or Firm—Schwegman, Lundberg, Woessner & Kluth, P.A.

(57) ABSTRACT

A state machine and an associated method for achieving a faster response time for an interruption of an erase operation in a flash memory are disclosed. In particular, a state machine having a plurality of interconnected execution cycles is disclosed. The execution cycles include incremental cycles and other cycles. The state machine also includes a plurality of suspend cycles. Each suspend cycle is connected directly to one of the execution cycles. At least one of the suspend cycles is connected directly to one of the other cycles. The plurality of suspend cycles interrupt the erase operation in response to a suspend command by adjusting one shot timing circuits, timer counters, and timing circuits included in the state machine. The state machine may include a plurality of interconnected groups, each having a plurality of execution cycles. The groups may include a pre-program group for setting up and verifying the erase operation, an erasing group for erasing a block of memory, and a distribution and adjustment group for completing the erase operation, where the distribution and adjustment group does not include incremental cycles.

21 Claims, 3 Drawing Sheets

STATE MACHINE HAVING EACH EXECUTION CYCLE DIRECTLY CONNECTED TO A SUSPEND CYCLE TO ACHIEVE FAST SUSPEND OF ERASE OPERATION IN FLASH MEMORIES

This application is a continuation of U.S. patent application Ser. No. 08/965,253 filed Nov. 6, 1997, now U.S. Pat. No. 6,081,870.

BACKGROUND

The present invention relates to operations in flash memory devices. More particularly, the present invention relates to a method and apparatus to suspend an operation in a flash memory device.

Flash memory devices have proven to be important memory elements in the past several years, and industry pundits predict an ever-increasing role for such devices in the future. A great advantage flash memory devices have over typical eraseable programmable read only memories (EPROM's) and electrically erasable programmable read only memories (EEPROM's) are, respectively, system programmability and lower cost.

Despite the many advantages of flash memories over other memories, flash memory devices have several opportunities for improvement. For example, flash memories in their typical implementations suffer from the problems of "over erasure" and "wild bits" which result in all bits not behaving exactly alike with respect to their electrical behavior. In fact, many flash memory devices include wide variations of electrical behavior between adjacent bits.

Designers of flash memory devices have developed very sophisticated schemes in order to resolve the problems related to bits having disparate electrical behavior. For example, a flash memory device during programing or erasing of the memory elements proceeds through a process of interrogating each memory element and evaluating the respective margins after the operation to determine whether it needs to be re-programmed or further erased. The individual treatment of memory elements has caused the logic circuitry associated with flash memories to become very complicated.

Memory arrays in flash memory devices typically must be programmed before they can be erased in order to avoid erasing bits into a very negative threshold and disturbing data in other bits during reading. Even during the cycle of programming, the device determines if the bits are sufficiently programmed. A unique verification cycle for an erase operation is performed. Some devices tighten the distribution of memory element threshold voltages after the erase operation for better manufacturability. The memory device also often determines, after the erase operation, whether the data in the memory array remains undisturbed. These procedures, as appreciated by those skilled in the art, are very sophisticated.

In order to perform such a sophisticated operation, an equally sophisticated state machine is often required. Simply put, a state machine can be a controller in a flash memory device or other integrated circuit. The state machine typically includes several steps that must be performed in the erase operation. This operation takes a relatively long period of time for the processors executing the steps, which could be in the order of seconds. Rather than necessarily occupying the processor during this time, a suspend command has been developed to permit the operation to stop itself and allow the processor to read an unaffected block of memory.

In prior art flash memories, a suspend command was permitted only during certain predetermined steps in the operation of the state machine. Only certain cycles in the operation could be suspended, which itself proved difficult to implement. For example, if analog voltage generation or discharge was required, a suspended cycle would often prevent a state machine from functioning properly.

The consequence of a limited number of suspend operations had a deleterious effect on response time. In certain cases, the system was required to wait for up to 100's of milliseconds to attain a suspendable cycle. Although the prior art suspend system proved to have a better response time than without a suspend command, much room for improvement was left for flash memories to achieve response times in the order of similar devices.

SUMMARY OF THE INVENTION

The present invention relates to a state machine and an associated method for achieving a faster response time for an interruption of an erase operation. In particular, the present invention is directed to a state machine having a plurality of interconnected execution cycles. The execution cycles include incremental cycles and other cycles. The state machine also includes a plurality of suspend cycles. Each suspend cycle is connected directly to one of the execution cycles. At least one of the suspend cycles is connected directly to one of the other cycles.

DETAILED DESCRIPTION OF THE PREFERRED EMBODIMENTS

Figure 1:
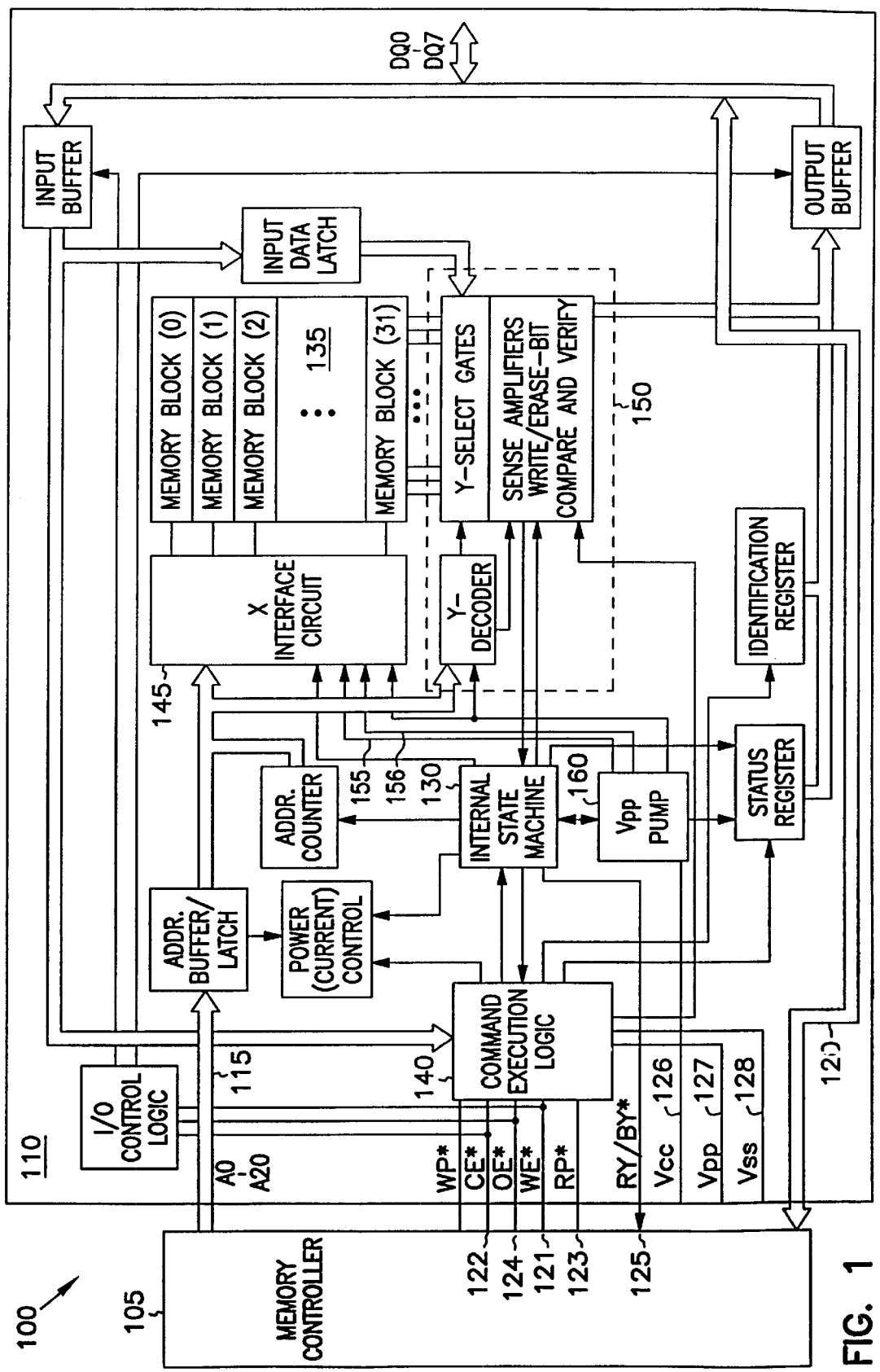
FIG. 1 shows a schematic diagram illustrating generally a memory system embodying features of the present invention.

In the following detailed description, reference is made to the accompanying drawings which form a part hereof, and in which is shown, by way of illustration, specific embodiments in which the invention may be practiced. In the drawings, like numerals describe substantially similar components throughout the several views. The embodiments are described in sufficient detail to enable those of ordinary skill in the art to practice the invention. Other embodiments may be used and logical, structural, and electrical changes may be made without departing from the scope of the present invention.

The term substrate is used in the following description and includes any semiconductor-based structure having an exposed surface with which to form the integrated circuit structure of the invention. The term substrate is used to refer to semiconductor structures during processing, and may include other layers that have been fabricated thereupon. The term substrate includes doped and undoped semiconductors, epitaxial semiconductor layers supported by a base semiconductor or insulator, as well as other semiconductor structures well known to one of ordinary skill in the art. The following detailed description is not to be taken in a limiting sense, and the scope of the present invention is defined only by the appended claims and their equivalents.

FIG. 1 is a schematic diagram illustrating generally, by way of example, but not by way of limitation, one embodiment of a memory system 100 embodying features of the present invention. Memory system 100 includes memory controller 105 and memory integrated circuit (IC) 110. Controller 105 includes a microprocessor or any other controller 105 providing interface signals to the memory IC 110, as described below. Such interface signals include addressing signals, provided at address lines 115, and data signals, communicated at data lines 120. Other interface signals provided by controller 105 include write enable (WE*) at node 121, chip enable (CE*) at node 122, reset/power-down (RP*) at node 123, and output enable (OE*) at node 124, all of which are active low signals. Memory IC 110 provides a status signal (RY/BY*) at node 125 to controller 105 to indicate the status of internal state machine 130. Memory IC 110 also receives a positive power supply voltage ($V_{CC}$) at node 126 (e.g., approximately 3.3 Volts or approximately 5 Volts), a write/erase supply voltage ($V_{PP}$) at node 127 (e.g., approximately 5 Volts), and a reference voltage such as substrate ground voltage ($V_{SS}$) at node 128 (e.g., approximately 0 Volts).

In the embodiment of FIG. 1, memory IC 110 includes a memory cell array 135 of floating gate transistor memory cells arranged in 32 memory cell blocks. Each memory cell block in memory cell array 135 contains 64 kilobytes of floating gate transistor memory cells. Data stored in each memory cell block is erased independently, as described below, without disturbing data stored in other memory cell blocks. A command execution logic module 140 receives the above-described interface signals from controller 105. Command execution logic module 140 controls internal state machine 130, which provides write and block erase timing sequences to memory cell array 135 through X-interface circuit 145 and Y-interface circuit 150.

Y-interface circuit 150 provides access to individual memory cells through data lines in memory cell array 135. Y-interface circuit 150 includes a Y-decoder circuit, Y-select gates, sense-amplifiers, and write/erase bit compare and verify circuits. X-interface circuit 145 provides access to rows of memory cells through wordlines in memory cell array 135, which are electrically coupled to control gates (also called select gates) of floating gate transistors in memory cell array 135. X-interface circuit 145 includes decoding and control circuits for erasing individual blocks of memory cells in memory cell array 135.

Figure 2:
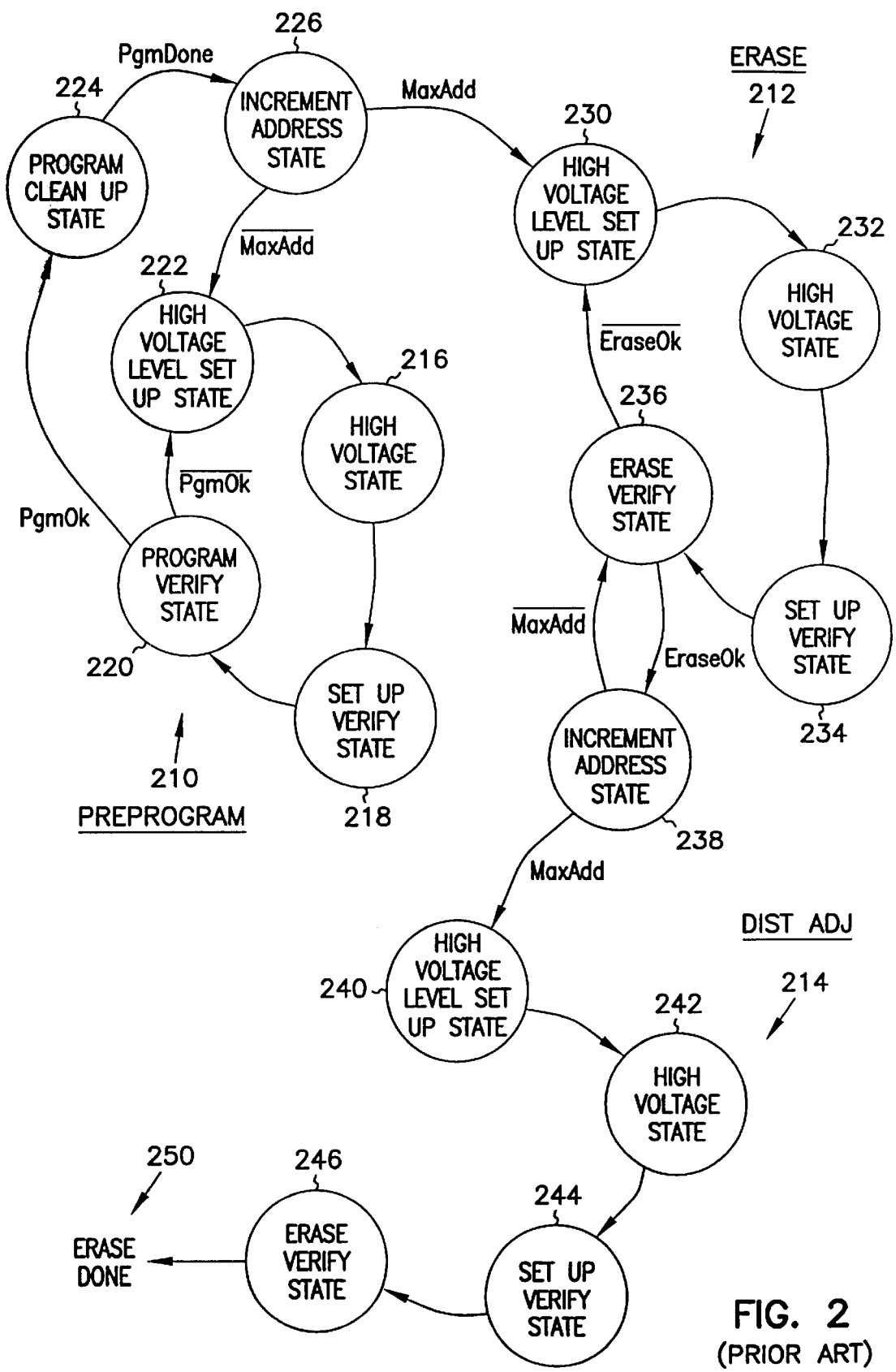
FIG. 2 shows a state diagram of a prior art erase operation for use with a state machine.

FIG. 2 shows a state diagram of a prior art state machine for controlling an erase operation in a flash memory. A similar state machine is described in U.S. Pat. No. 5,619,453, the disclosure of which is hereby incorporated by reference for its description of the state diagram therein. The erase operation includes a plurality of interconnected execution cycles including incremental cycles and other cycles. The execution cycles of the erase operation are arranged in a plurality of interconnected groups, including a pre-program group 210, an erase group 212, and a distribution and adjustment group 214 connected together in the order shown. In order to erase a block of flash memory, a prior art state machine would execute the cycles in the interconnected groups which effectively could take seconds to complete.

The pre-program group 210 includes a plurality of interconnected execution states or cycles including incremental cycles and other cycles. As shown in FIG. 2, the pre-program group includes a high voltage state 216 connected to a setup verify state 218. The setup verify state 218 is connected to a program verify state 220. If the program verify state 220 determines that the program is not okay (not in order), the operation jumps to a high voltage level setup state 222. The high voltage level setup state 222 is connected back to the high voltage state 216. If the program verify state 220 determines that the program is indeed okay (in order), the operation jumps to a program cleanup state 224. The above described states are designated as other cycles, as opposed to incremental cycles described below.

The program clean up state 224 jumps to an increment address state 226 when the operation has completed the program for a given address. The increment address state 226 is designated as an incremental cycle because it adjusts a variable, determines if the adjusted variable is a predefined stopping point, and, if so, proceeds with the operation. If not, the incremental cycles sends the operation back into another loop, as appreciated by those skilled it the art. With regard to the increment address state 226, the operation increases the address variable and compares it to a predetermined maximum address. If the variable is at the maximum address, the operation proceeds to the erase group 212. If not, the operation jumps back to the high voltage level setup state 222 and repeats the cycles in the preprogram group.

The erase group 212 also includes a plurality of cycles including incremental cycles and other cycles. The initial cycle in the erase group 212 is a high voltage level setup state 230 which takes approximately 400 nanoseconds to complete. The high voltage level setup state 230 then jumps to a high voltage state 232 which takes approximately 10 milliseconds to complete. The next cycle is the setup verify state 234, which takes approximately 5 microseconds to complete. The erase verify state 236 follows the setup verify state 234 and takes approximately 200 nanoseconds to complete. The above described cycles of the erase group 212 are known as other cycles, again as opposed to incremental cycles. If the erase verify state 236 determines that the erase operation is complete, the operation jumps to an increment address state 238 which is an incremental cycle.

The increment address state 238 of the erase group 212 is designated as an incremental cycle because, like the increment address state 226 of the pre-program group 210, it adjusts a variable, determines if the adjusted variable is a predefined stopping point, and, if so, proceeds with the operation. If not, the incremental cycle sends the operation back into another loop. With regard to the increment address state 238 of the erase group 212, the operation increases the address variable and compares it to a predetermined maximum address. If the variable is at the maximum address, the operation proceeds to distribution and adjustment group 214. If not, the operation jumps back to the erase verify state 236.

The distribution and adjustment group 214 includes a plurality of other cycles, but the group 214 of the present example does not include any incremental cycles. The erase group 212 jumps to the high level setup state 240 of the distribution and adjustment group 214. The high voltage level setup state 240 takes approximately 400 nanoseconds to complete. The high voltage state 242 follows the high voltage level setup state 240. The high voltage state 242 takes approximately 100 milliseconds to complete. The setup verify state 244, which takes approximately 5 microseconds to complete, follows the high voltage state 242. The erase verify state 246 is the next state in the succession of cycles. The erase verify state 246 takes approximately 200 nanoseconds to complete. When complete, the operation proceeds to erase done 250.

A suspend command could come at any moment during the operation of the state machine while performing the operation. In the prior art, however, a suspend command was only acknowledged at the incremental cycles 226, 238 of the groups. This process of "wait for a suspendable cycle" proved to have deleterious effect on response time. For example, the distribution and adjustment group 214 does not include an incremental cycle, and the operation was required to proceed to erase done 250 in order to free the processor. If a suspend command was issued at the beginning of the high voltage level setup state 240 of the distribution and adjustment group 214, the processor would wait in the 100's of milliseconds to be acted upon by the state machine.

Figure 3:
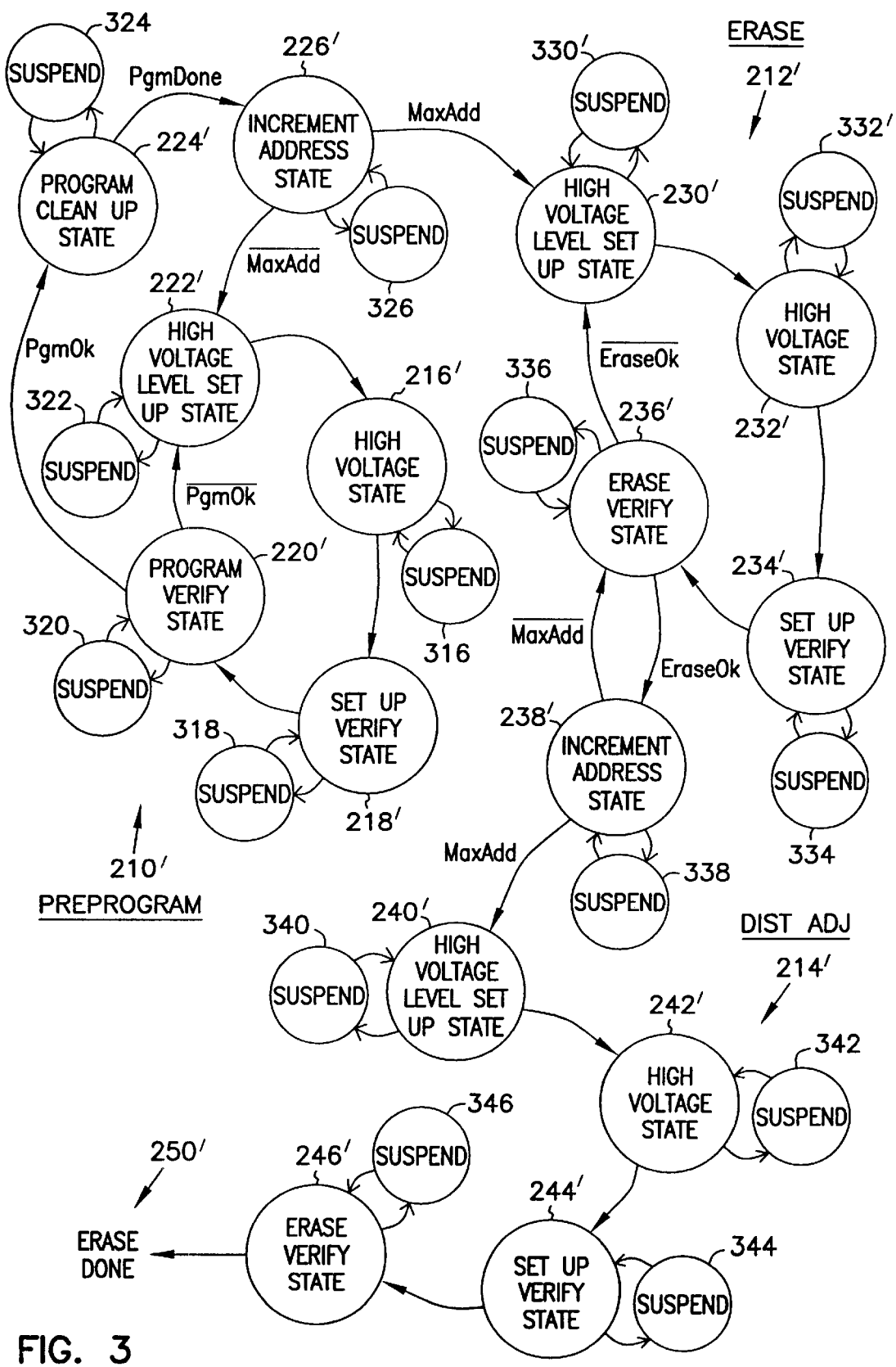
FIG. 3 shows a state diagram embodying features of the present invention and suitable for implementation in the memory system of FIG. 1.

FIG. 3 shows a state machine 130 constructed in accordance with the present invention and suitable for use with memory system 100. As indicated, the basic operation of the three groups are the same as the prior art machine. Therefore, like cycles and groups of the present state machine are indicated with reference numerals having a prime notation. The present state machine further includes a suspend cycle connected directly to each execution cycle. In the preferred embodiment, a suspend cycle is connected to execution cycles of all three groups 210', 212', 214'. Also, as indicated in the preferred embodiment, suspend cycles are connected to both incremental cycles and other cycles.

In the embodiment shown, a suspend cycle is connected directly to each execution cycle of the pre-program group 210'. A suspend high voltage state 316 is connect to cycle 216'. A suspend setup verify state 318 is connected to cycle 218'. A suspend program verify state 320 is connected to cycle 220'. A suspend high voltage level setup state 322 is connected to cycle 222'. A suspend program cleanup state 324 is connected to cycle 224', which constitutes an "other" cycle of the execution cycles in the pre-program group 210'. Also, a suspend increment address state 326 is connected to cycle 226', which is an incremental cycle in the pre-program group 210'.

A suspend cycle is connected to each execution cycle of the erase group 212'. A suspend high voltage level setup state 330 is connected to cycle 230'. A suspend high voltage state 332 is connected to cycle 232'. A suspend setup verify state 334 is connected to cycle 234'. A suspend erase verify state 336 is connected to cycle 236', which constitutes an "other" cycle of the execution cycles in the erase group 212'. Also, a suspend increment address state 338 is connected to cycle 238', which is an incremental cycle in the erase group 212'.

Finally, a suspend cycle is connected to each execution cycle of the distribution and adjustment group 214'. A suspend high voltage level setup cycle 340 is connected to cycle 240'. A suspend high voltage cycle 342 is connected to cycle 242'. A suspend setup verify cycle 344 is connected to cycle 244'. Also, a suspend erase verify cycle 346 is connected to cycle 246'. As described, all of the execution cycles in the distribution and adjustment group 214' include "other" cycles, i.e., the distribution and adjustment group 214' does not include incremental cycles.

The above described state machine has many advantages. Among these include an operation which is able to suspend itself at any cycle along its loop, thereby permitting faster interrupts. Upon receiving a suspend command from the processor, a signal would go to all timing elements in a state machine, including one shots and timer circuits and timer counters, as understood by those skilled in the art, the effect of which would be to greatly reduce the inherent timing delay. For example, a timer circuit would short circuit across some capacitors or resistors for the timer, bypass any counting mechanism of the timer counter, and modify the one shots to bypass a portion of the respective timing delay.

It is to be understood that the above description is intended to be illustrative, and not restrictive. Many other embodiments will be apparent to those of skill in the art upon reviewing the above description. The invention should, therefore, be determined with reference to the appended claims, along with the full scope to which such claims are entitled.

What is claimed is:

1. A state machine for controlling an erase operation on a memory cell, comprising:

a preprogram group of cycles, an erase group of cycles, and an adjustment group of cycles, each group of cycles comprising:

a plurality of interconnected execution cycles; and a plurality of suspend cycles, each suspend cycle connected directly to one of the execution cycles, such that each of the plurality of interconnected execution cycles is directly connected to one of the plurality of suspend cycles.

2. The state machine of claim 1 wherein the plurality of suspend cycles interrupt the erase operation in response to a suspend command by adjusting timing circuits included in the state machine.

3. The state machine of claim 1 wherein the plurality of suspend cycles interrupt the erase operation in response to a suspend command by adjusting one shot timing circuits, timer counters, and timing circuits included in the state machine.

4. The state machine of claim 3 wherein resistive elements or capacitive elements of the one shot timing circuits, timer counters, and timing circuits are shorted in response to the suspend command.

5. A state machine for controlling an erase operation on a memory cell, comprising:

a plurality of interconnected groups, each having a plurality of execution cycles; and a plurality of suspend cycles, each connected directly to an execution cycle, such that each execution cycle is directly connected to a suspend cycle.

6. The state machine of claim 5 wherein the groups include a pre-program group, an erase group, and a distribution and adjustment group.

7. The state machine of claim 6 wherein the pre-program group and erase group include incremental cycles.

8. The state machine of claim 7 wherein the distribution and adjustment group does not contain incremental cycles.

9. A state machine, comprising:

a plurality of interconnected execution cycles for controlling an erase operation; and a plurality of suspend cycles for suspending the erase operation, wherein each of the plurality of interconnected execution cycles is directly connected to one of the plurality of suspend cycles.

10. The state machine of claim 9 wherein the plurality of interconnected execution cycles are arranged in a pre-program group for setting up and verifying the erase operation, an erase group for erasing a block of memory, and a distribution and adjustment group for completing the erase operation.

11. A state machine, comprising:

a plurality of interconnected execution cycles for controlling an erase operation, the execution cycles including incremental cycles in a predetermined loop and other cycles;

wherein the plurality of execution cycles are arranged in a pre-program group for setting up and verifying the erase operation, an erase group for erasing a block of memory, and a distribution and adjustment group for completing the erase operation; and a plurality of suspend cycles for suspending the erase operation, wherein each suspend cycle is connected directly to an execution cycle such that each of the plurality of interconnected execution cycles is directly connected to one of the plurality of suspend cycles.

12. The state machine of claim 11 wherein the distribution and adjustment group does not include incremental cycles.

13. A state machine for controlling an erase operation on a memory cell, comprising:

a plurality of timing circuits for controlling timing functions of the state machine, the erase operation comprising a pre-program sequence, an erase sequence, and an adjustment sequence, each sequence comprising:
a plurality of interconnected execution cycles; and
a plurality of suspend cycles, each suspend cycle being directly connected to one of the interconnected execution cycles such that each of the plurality of interconnected execution cycles is directly connected to one of the plurality of suspend cycles, wherein the plurality of suspend cycles interrupt the erase operation in response to a suspend command by adjusting the timing circuits included in the state machine.

14. The state machine of claim 13 wherein the timing circuits comprise one shot timing circuits and timer counters.

15. The state machine of claim 13 wherein resistive elements or capacitive elements of the timing circuits are shorted in response to the suspend command.

16. The state machine of claim 13 wherein the plurality of interconnected execution cycles of the pre-program sequence comprises:

a set up verify state;

a program verify state;

a high voltage level set up state;

a high voltage state;

a program clean up state; and an increment address state.

17. The state machine of claim 13 wherein the plurality of interconnected execution cycles of the erase sequence comprises:

a high voltage level set up state;

a high voltage state;

a set up verify state;

an erase verify state; and an increment address state.

18. The state machine of claim 13 wherein the plurality of interconnected execution cycles of the adjustment sequence comprises:

a high voltage level set up state;

a high voltage state;

a set up verify state; and an erase verify state.

19. A state machine for controlling an erase operation on a memory array, comprising:

a plurality of timing circuits for controlling timing functions of the state machine, the erase operation comprising a pre-program sequence, an erase sequence and an adjustment sequence, wherein:
the pre-program sequence comprises a set up verify state, a program verify state, a high voltage level set up state, a high voltage state, a program clean up state, an increment address state, and a first plurality of suspend cycles each connected to one of the states of the pre-program sequence, such that each one of the states of the pre-programmed sequence are directly connected to one of the first plurality of suspend cycles;
the erase sequence comprises a high voltage level set up state, a high voltage state, a set up verify state, an erase verify state, an increment address state; and a second plurality of suspend cycles each connected to one of the states of the erase sequence, such that each one of the states of the erase sequence are directly connected to one of the second plurality of suspend cycles; and
the adjustment sequence comprises a high voltage level set up state, a high voltage state, a set up verify state, an erase verify state, and a third plurality of suspend cycles each connected to one of the states of the adjustment sequence, such that each one of the states of the adjustment sequence are directly connected to one of the third plurality of suspend cycles, wherein the first, second, and third plurality of suspend cycles interrupt the erase operation in response to a suspend command by adjusting the timing circuits included in the state machine.

20. The state machine of claim 19 wherein the timing circuits comprise one shot timing circuits and timer counters.

21. The state machine of claim 19 wherein resistive elements or capacitive elements of the timing circuits are shorted in response to the suspend command.

* * * * *

UNITED STATES PATENT AND TRADEMARK OFFICE
CERTIFICATE OF CORRECTION

PATENT NO. : 6,598,113 B2
DATED : July 22, 2003
INVENTOR(S) : Frankie F. Roohparvar It is certified that error appears in the above-identified patent and that said Letters Patent is hereby corrected as shown below:

<u>Title Page,</u>
Item [56], References Cited, U.S. PATENT DOCUMENTS insert the following:
   -- 5,341,330     8/1994  Wells et al. ..................... 365/185.33 -- ; insert the following below "5,355,464 10/1994     Fandrich et al. ....... 365/218":

5,557,576     9/1996  Roohparvar et al ............ 365/185.03 -- ; insert the following below "5,568,426 10/1996     Roohparvar, et al ...... 365/185.22":

| | | |
|---|---|---|
| 5,619,453 | 4/1997 | Roohparvar et al. ........ 365/185.33 |
| 5,627,786 | 5/1997 | Roohparvar ......... ..... 365/200 |
| 5,636,166 | 6/1997 | Roohparvar............... 365/194 |
| 5,742,787 | 4/1998 | Talreja.......... ........... 711/103 |
| 5,805,501 | 9/1998 | Shiau et al................. 365/185.29 |
| 5,937,424 | 8/1999 | Leak et al................. 711/103 -- |

Signed and Sealed this

Twenty-ninth Day of June, 2004

JON W. DUDAS
*Acting Director of the United States Patent and Trademark Office*